(12) United States Patent
Schrittwieser et al.

(10) Patent No.: US 8,914,974 B2
(45) Date of Patent: Dec. 23, 2014

(54) METHOD FOR INTEGRATING AN ELECTRONIC COMPONENT INTO A PRINTED CIRCUIT BOARD

(75) Inventors: Wolfgang Schrittwieser, Kapfenberg (AT); Patrick Lenhardt, Spielberg bei Knittelfeld (AT); Klaus Merl, Bruck a. d. Mur (AT)

(73) Assignee: AT & S Austria Technologie & Systemtechnik Aktiengesellschaft, Leoben-Hinterberg (AT)

( * ) Notice: Subject to any disclaimer, the term of this patent is extended or adjusted under 35 U.S.C. 154(b) by 518 days.

(21) Appl. No.: 13/125,885

(22) PCT Filed: Oct. 28, 2009

(86) PCT No.: PCT/AT2009/000418
§ 371 (c)(1),
(2), (4) Date: Apr. 25, 2011

(87) PCT Pub. No.: WO2010/048653
PCT Pub. Date: May 6, 2010

(65) Prior Publication Data
US 2011/0203107 A1      Aug. 25, 2011

(30) Foreign Application Priority Data
Oct. 30, 2008 (AT) .................. GM619/2008
Aug. 25, 2009 (AT) .................. GM529/2009

(51) Int. Cl.
*H05K 3/30* (2006.01)
*H05K 3/36* (2006.01)
(Continued)

(52) U.S. Cl.
CPC ............ *H01L 24/83* (2013.01); *H01L 21/6835* (2013.01); *H01L 23/5389* (2013.01);
(Continued)

(58) Field of Classification Search
CPC ... H01L 21/6835; H01L 23/544; H01L 24/29; H01L 23/5389; H01L 24/24; H01L 24/83; H01L 24/32; H05K 1/188
USPC .................................................. 29/841, 830
See application file for complete search history.

(56) References Cited

U.S. PATENT DOCUMENTS 4,830,014 A * 5/1989 Goodman et al. ............ 600/310
5,224,478 A * 7/1993 Sakai et al. .................... 600/335
(Continued)

FOREIGN PATENT DOCUMENTS

CN       1344484        4/2002
DE       199 54 941     6/2001
(Continued)

OTHER PUBLICATIONS

M. Hessling et al., "Präzise Löcher Laserbohren von Mikrovias in Leiterplatten (Precise Holes Laser Drilling of Micro Vias in Printed Circuit Boards," Laser-Praxis Nr. 3, Oct. 2001, S. 14-16, partial English translation provided.

*Primary Examiner* — David Angwin
(74) *Attorney, Agent, or Firm* — Jacobson Holman Hershkovitz, PLLC.

(57) ABSTRACT

The invention relates to a method for integrating an electronic component into a printed circuit board, whereby the electronic component (4) comprising contacts (6) oriented towards an insulating layer (1) which is fixed to a laminate consisting of a conductive layer (2) and a insulating layer (1). Once the component (4) has been fixed to the insulating layer (1), at least one hole or perforation (8, 11) corresponding to the contacts (6) of the component (4) are formed in the conducting layer (2) and in the insulating layer (1), the contacts come into contact with the conducting layer (2), enabling a reliable integration or embedding of an electronic component (4) into a printed circuit board.

22 Claims, 7 Drawing Sheets

(51) Int. Cl.
*H01L 23/00* (2006.01)
*H01L 21/683* (2006.01)
*H01L 23/538* (2006.01)
*H01L 23/544* (2006.01)
*H05K 1/18* (2006.01)
*H05K 3/00* (2006.01)
*H05K 3/02* (2006.01)

(52) U.S. Cl.
CPC .............. *H01L 23/544* (2013.01); *H01L 24/24* (2013.01); *H01L 24/82* (2013.01); *H05K 1/185* (2013.01); *H05K 1/188* (2013.01); *H01L 24/29* (2013.01); *H01L 24/32* (2013.01); *H01L 2221/68345* (2013.01); *H01L 2223/54426* (2013.01); *H01L 2223/54473* (2013.01); *H01L 2224/2402* (2013.01); *H01L 2224/83121* (2013.01); *H01L 2224/83192* (2013.01); *H01L 2224/8385* (2013.01); *H01L 2224/92144* (2013.01); *H01L 2924/01004* (2013.01); *H01L 2924/01005* (2013.01); *H01L 2924/01013* (2013.01); *H01L 2924/01029* (2013.01); *H01L 2924/01032* (2013.01); *H01L 2924/01033* (2013.01); *H01L 2924/01047* (2013.01); *H01L 2924/01074* (2013.01); *H01L 2924/01078* (2013.01); *H01L 2924/01082* (2013.01); *H01L 2924/078* (2013.01); *H01L 2924/07802* (2013.01); *H05K 3/0035* (2013.01); *H05K 3/0038* (2013.01); *H05K 3/025* (2013.01); *H05K 3/305* (2013.01); *H05K 2201/0355* (2013.01); *H05K 2201/09509* (2013.01); *H05K 2201/09918* (2013.01); *H05K 2201/10674* (2013.01); *H05K 2201/10977* (2013.01); *H05K 2203/0554* (2013.01); *H05K 2203/108* (2013.01); *H05K 2203/1469* (2013.01); *H01L 2224/32225* (2013.01); *H01L 2924/01006* (2013.01); *H01L 2924/014* (2013.01)
USPC ................................................ 29/841; 29/830

(56) References Cited

U.S. PATENT DOCUMENTS

| 5,776,059 | A  | * | 7/1998  | Kaestle et al.      | 600/340 |
| 5,792,052 | A  | * | 8/1998  | Isaacson et al.     | 600/323 |
| 6,119,335 | A  | * | 9/2000  | Park et al.         | 29/830  |
| 6,236,037 | B1 | * | 5/2001  | Asada et al.        | 250/221 |
| 6,388,247 | B2 | * | 5/2002  | Asada et al.        | 250/221 |
| 6,803,528 | B1 | * | 10/2004 | Koyanagi            | 174/262 |
| 6,883,231 | B2 | * | 4/2005  | Igarashi et al.     | 29/840  |
| 8,190,224 | B2 | * | 5/2012  | Hoarau              | 600/310 |
| 8,329,493 | B2 | * | 12/2012 | Mascaro et al.      | 438/51  |
| 2005/0253244 | A1 | * | 11/2005 | Chang            | 257/692 |
| 2005/0286901 | A1 | * | 12/2005 | Sasser et al.    | 398/135 |
| 2006/0278967 | A1 | * | 12/2006 | Tuominen et al.  | 257/686 |
| 2008/0067666 | A1 | * | 3/2008  | Hsu              | 257/700 |
| 2008/0091121 | A1 | * | 4/2008  | Sun et al.       | 600/587 |
| 2009/0168374 | A1 | * | 7/2009  | Clayton et al.   | 361/749 |
| 2010/0238636 | A1 | * | 9/2010  | Mascaro et al.   | 361/750 |
| 2011/0203107 | A1 | * | 8/2011  | Schrittwieser et al. | 29/841 |
| 2012/0255166 | A1 | * | 10/2012 | Kim et al.       | 29/846  |
| 2012/0314382 | A1 | * | 12/2012 | Wesselmann et al. | 361/749 |
| 2013/0087369 | A1 | * | 4/2013  | Kim et al.       | 174/254 |

FOREIGN PATENT DOCUMENTS

| EP | 1 111 662 | 6/2001 |
| FR | 2 822 338 | 9/2002 |
| JP | 2-27831 B | 6/1990 |
| JP | 10-190234 | 7/1998 |
| JP | 2003-168860 A | 6/2003 |
| JP | 2003-204137 A | 7/2003 |
| JP | 2004-296562 A | 10/2004 |
| JP | 2006523375 A | 10/2006 |
| JP | 2007-019268 A | 1/2007 |
| KR | 100730782 | 6/2007 |
| TW | 429735 | 4/2001 |
| WO | 00/57680 | 9/2000 |
| WO | 03/065778 | 8/2003 |
| WO | 03/065779 | 8/2003 |
| WO | 2004/077902 | 9/2004 |
| WO | 2005/104636 | 11/2005 |
| WO | 2006/134216 | 12/2006 |

* cited by examiner

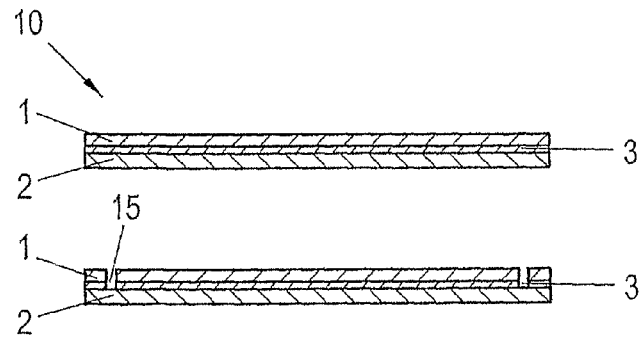
Fig. 2a
Fig. 2b
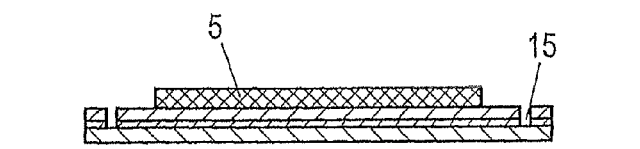
Fig. 2c
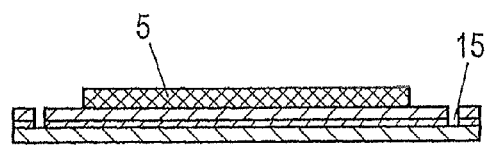
Fig. 2d
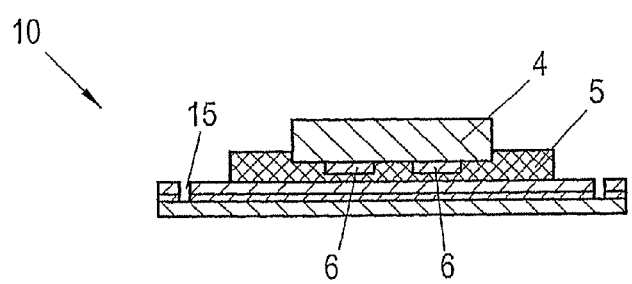
Fig. 2e
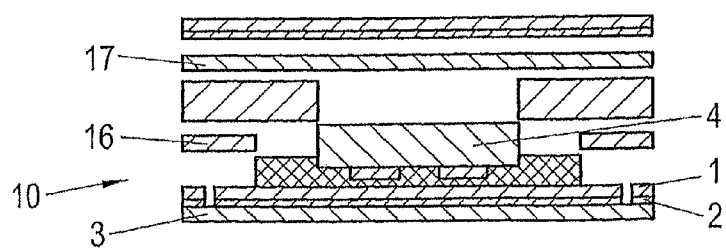
Fig. 2f
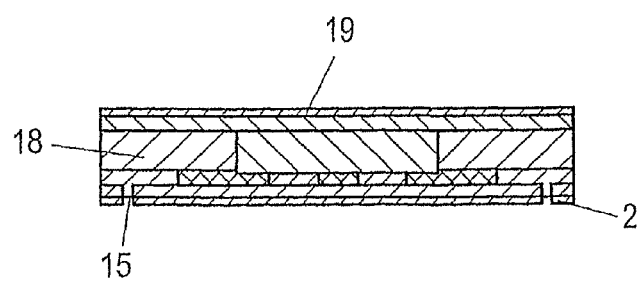

US 8,914,974 B2

METHOD FOR INTEGRATING AN ELECTRONIC COMPONENT INTO A PRINTED CIRCUIT BOARD

This is a national stage of PCT/AT2009/000418 filed Oct. 28, 2009 and published in German, which has a priority of Austria no. GM 619/2008 filed Oct. 30, 2008 and Austria no. GM 529/2009 filed Aug. 25, 2009, hereby incorporated by reference.

FIELD OF THE INVENTION

The present invention relates to a method for integrating an electronic component into a printed circuit board, whereby the electronic component comprising contacts oriented towards the insulating layer is fixed to a laminate at least consisting of a conducting or conductive layer and a non-conducting or insulating layer.

PRIOR ART

In the context of growing product functionalities of apparatus provided with electronic components and the increasing miniaturization of such electronic components as well as the increasing number of electronic components to be loaded on printed circuit boards, efficient field-likely or array-likely configured components or packages including several electronic components comprising pluralities of contacts or connections at increasingly reduced distances between said contacts are used to an increasing extent. For fixing or contacting such components, the use of strongly disentangled printed circuit boards is increasingly required, wherein it is to be anticipated that, with the simultaneous reduction of the product sizes as well as the components and circuit boards to be used, it is to be expected, both in terms of the thicknesses and in terms of the surfaces of such elements, that the loading and arrangement of such electronic components via the required plurality of contact pads on printed circuit boards will become problematic, reaching the limits of the possible pattern definition of such contact pads.

To solve these problems, it has meanwhile been proposed to integrate electronic components at least partially into a printed circuit board, reference being, for instance, made to WO 03/065778, WO 03/065779, WO 2004/088902, WO 2006/134216 or DE-C 19954941. Those known methods and embodiments of electronic components or components integrated in a printed circuit board, however, involve the drawback that recesses or holes are each to be provided in a base element of a printed circuit board for receiving such electronic components or components, wherein conductor tracks are additionally formed prior to the arrangement of a component in such a hole. For contacting the components, soldering processes and bonding techniques are used, usually resulting in contact sites or contact pads between materials of different types between elements of the conductor tracks and the contact sites or junctions of the electronic components. Particularly when using such systems in environments affected by great temperature differences and regions with variable temperatures, mechanically and thermally induced tensions will be created due to the use of different materials in the region of the contact sites or junctions considering the different thermal expansion coefficients, which tensions may lead to a crack of at least one contact site or junction, and hence to a failure of the component. Moreover, it is to be anticipated that bores, particularly laser bores, additionally required in conductive layers for the production of contact surfaces prior to the arrangement of the component will stress the components. Furthermore, it is disadvantageous that contacting or bonding of the components embedded in the recesses or depressions to be produced, on conductor tracks and contact surfaces will be complicated and, in particular, will not be reliably achievable when used under varying temperature stresses. In addition, it is disadvantageous that the high pressures and temperatures to be provided, if necessary, during the circuit board production process will stress the embedded and contacted components.

When producing an electronic module, or embedding or integrating an electronic component into a printed circuit board, it is moreover known, for instance, from WO 2006/056643 to produce openings or perforations at least in the conducting layer on a laminate formed by a conducting or conductor layer and a non-conducting or insulator layer, the position of those openings having to correspond to the positions of contacts of a component to be subsequently fixed to the insulating layer. That known embodiment, in particular, involves the drawback that, for instance, when taking into account the usually extremely large number of contacts of such electronic components to be integrated in a printed circuit board with accordingly small tolerances, the openings or perforations to be previously produced for the subsequent fixation of the component have to be produced in a separate or additional method step. Bearing in mind the extremely small tolerances due to the small sizes of such components, a precise adaptation of the holes or perforations to be previously produced, to the contacts of a component to be fixed subsequently is to be effected, which will not only call for major additional expenditures for forming such holes or perforations, but also entail an accordingly high amount of rejects due to imperfectly precise positioning of the holes or perforations relative to the contacts of a component to be fixed subsequently. That known embodiment, furthermore, involves the drawback of requiring further method steps after the fixation of the component to the laminate including holes or perforations, in particular for sheathing the component and hence embedding the same, wherein, during such method steps, gas or air present, for instance, in the previously produced holes or perforations will adversely affect laminating or pressing procedures for embedding the component, above all by the formation of bubbles. Such bubbles may, moreover, lead to additional problems when electrically contacting the components, or to the mutual separation of components or circuit board layers.

In a similar manner, a method can, for instance, be taken from EP-A 1 111 662, wherein patterning of a conducting layer corresponding to contacts of the component to be fixed is performed prior to arranging or fixation an electronic component, such previously performed patterning or formation of holes or perforations at least in the conducting layer of a likewise multilayer laminate again involving the above-mentioned drawbacks in respect to the tolerances to be observed and the orientation of the component to be fixed subsequently. An additional disadvantage of such preceding patterning of a conducting layer, moreover, resides in that such patterning of the conducting layer prior to the fixation of the component to be fixed requires the removal of an optionally present protection or carrier layer, this leading to an impairment and, in particular, damage of the patterned conducting layer, e.g. by scratches, the application of impurities or the like, during treatment or processing steps to follow.

SUMMARY OF THE INVENTION

The present invention thus aims to avoid or minimize the above-mentioned problems according to the prior art when integrating an electronic component into a printed circuit board, wherein it is particularly aimed at providing a method of the initially defined kind, which enables the simple and reliable positioning and embedding of an electronic component on or in a multilayer laminate of a circuit board by a simplified and reliable course of procedure. In particular, it is aimed at avoiding additional method steps for producing holes or perforations corresponding to the contacts of the component to be fixed prior to its fixation, and hence at improving or simplifying the fixation of such a component.

To solve these objects, a method of the initially defined kind is essentially characterized in that, once the component has been fixed to the insulating layer, holes or perforations corresponding to the contacts of the component are formed in the conducting layer and in the insulating layer, and the contacts are subsequently contacted with the conducting layer. Due to the fact that, according to the invention, the formation of holes or perforations corresponding to the contacts of the already fixed component does not take place until the fixation of the component on the insulating layer with the contacts oriented to the insulating or non-conducting layer, it has become possible to renounce cumbersome positioning and/or aligning steps for fixing the component with respect to already provided or previously produced openings or perforations as in the prior art, so as to readily enable the reliable positioning and arrangement of a component on the laminate. Following the fixation of the component to the insulating or non-conducting layer with the contacts oriented to the latter, it is possible in a simple and reliable manner and, in particular, in further steps usually provided in the production of a printed circuit board for patterning at least the conducting layer, and corresponding to the position of the already fixed component to be readily determinable on the laminate, to form holes or perforations both in the conducting layer and in the non-conducting layer for exposing the contacts of the component and contacting the same. It is thus immediately apparent that the process control proposed by the invention for the formation of holes or perforations corresponding to the contacts of the already fixed component allows for a substantially simpler fixation and, after this, a more reliable positioning and formation of the holes or perforations required for contacting the contacts, using known method steps usually applied in the production of printed circuit boards. It is, in particular, possible to simplify relative to the above-mentioned prior art the efforts taken in the precise positioning of the component to be fixed to the laminate, bearing in mind the fact that the holes or perforations for contacting the contacts are not produced until the fixation of the component to the laminate, and hence minimize or reduce the time required for producing the printed circuit board while integrating at least one component.

As already pointed out above, sheathing of such a component for embedding the same is usually performed after its fixation, wherein, in this respect, it is proposed according to a preferred embodiment of the method according to the invention that the electronic component, once it has been fixed to the insulating layer, is surrounded or sheathed by an insulating material, particularly at least one prepreg sheet and/or a resin, in a manner known per se. Such embedding or sheathing can be realized using prepreg sheets prefabricated according to the shape of the already fixed component, or a plurality of layers made of an insulating material or resin material.

For the reliable and safe embedment of the electronic component, it is, moreover, proposed in a preferred manner that the sheathing of the electronic component is realized by a pressing or laminating procedure of a plurality of insulating layers. Particularly when considering the fact that holes or perforations for contacting the contacts of the component are formed after the fixation of the latter and, in particular, also after sheathing of the electronic component, for instance by a pressing or laminating procedure, it will be safeguarded that such a pressing or laminating procedure for embedding the component will each be realized using substantially full-surface layers or sheets. Thus, in particular, no air or gas inclusions whatsoever will be present in at least some layers as opposed to the known prior art, which may lead to improper connections of individual layers during such a pressing or laminating procedure as are obtained in the prior art cited in the beginning, where holes or perforations corresponding to the contacts of the component to be subsequently fixed are already provided prior to the fixation of said component.

For a particularly reliable and safe fixation of the component to the laminate or, in particular, the insulating layer, it is proposed according to a further preferred embodiment that the electronic component is fixed to the insulating layer in a manner known per se using an adhesive.

In order to reliably ensure the removal of heat, which is optionally required at an accordingly high integration density and compactness of the component to be received, it is, moreover, proposed that a thermally conducting or conductive adhesive material, e.g. an adhesive or an adhesive tape, is used as in correspondence with a further preferred embodiment of the method according to the invention.

In the context of the formation of holes or perforations in the laminate, it is proposed according to a further preferred embodiment that the holes or perforations in the conducting layer are formed by a drilling procedure, particularly laser drilling, or an etching procedure. Such drilling procedures, for instance or in particular laser drilling, are known per se in the context of the production of a circuit board such that the formation of the holes or perforations required after the fixation of the electronic component to the laminate can be performed in the context of further patterning processes, particularly of the conducting layer, as already indicated above, so that, in particular, the consideration of additional method steps that would require additional time for the production or processing of such a circuit board can be obviated.

Furthermore, it is alternatively proposed by the invention to form the holes or perforations in the conducting layer by an etching procedure in the context of a photo-patterning process. Such an etching procedure in the context of a photo-patterning process is likewise known per se in connection with the production of a circuit board, and at least in special applications can result in a further acceleration of the manufacturing process by saving time when performing such an etching procedure rather than making individual holes or perforations by the aid of a laser.

Considering the materials used for the formation of the insulating or non-conducting layer as well as the conducting or conductive layer and, in addition, considering method steps optionally known or generally used in connection with the production and processing of multilayer circuit boards, it is proposed according to a further preferred embodiment that the formations of the holes or perforations in the conducting layer and in the insulating layer are performed in separate method steps following the fixation of the component. It is thus possible, particularly in coordination with the respective material properties of the conducting or conductive layer and of the non-conducting layer, to apply optimized methods for making the holes or perforations. In this respect, the formation of the holes or perforations can also be performed in the context of the implementation of further method steps irrespectively of the region of fixation of the component, for instance the patterning of individual layers or sheets of the circuit board.

For the production of the holes or perforations corresponding to the contacts of the already fixed and, advantageously, sheathed or embedded component with the required precision and at as low an expenditure of time as possible, it is proposed according to a further preferred embodiment of the method according to the invention that an UV laser is used when forming the holes or perforations in the conducting layer separately. Such high-performance UV lasers in a simple and reliable manner, and with the appropriate precision at an accordingly low expenditure or time, enable the formation of an optionally large number of holes or perforations corresponding to the contacts of the already fixed component.

In order to avoid excessive expenditures when adjusting or performing the drilling procedure by laser drilling using an UV laser in the conducting or conductive layer, since, at the simultaneous removal of the insulating layer narrow tolerances would have to be observed in order to avoid, in particular, damage to the adjoining contact of the already fixed component, it is proposed according to a further preferred embodiment that the holes or perforations in the insulating layer are made by a laser, particularly a $CO_2$ laser. By using a further laser, particularly a $CO_2$ laser, for making holes or perforations in the insulating layer in a further or separate method step, as already indicated above, it will not only be possible to use simpler and more cost-effective $CO_2$ lasers, which enable higher speeds or rates than UV lasers for the production of holes corresponding to the contacts of the already fixed component, but it will also be ensured that no damage to the contacts of the already fixed electronic component will occur, which are to be exposed after the removal of the insulating layer and, if necessary, residues of an adhesive. The use of such further lasers, which is also known per se in the context of the production of printed circuit boards, will thus enable the accordingly rapid and safe removal of the insulating material after the already performed formation of holes or perforations in the conducting layer.

In order to facilitate the orientation of the laser beam for removing the material of the insulating layer in the region of the holes or perforations of the conducting or conductive layer corresponding to the positions of the contacts of the already fixed component, it is proposed according to a further preferred embodiment that a laser beam whose dimension or diameter exceeds the clear width of the holes or perforations in the conducting layer is used for separately forming the holes or perforations in the insulating layer. By the dimension or diameter of the laser beam used for the formation of the holes or perforations in the insulating layer exceeding the clear width of the holes or perforations in the conducting layer, a low precision will do in view of the orientation of the laser beam for every perforation to be produced, since the respective hole or perforation in the insulating layer will be accordingly rapidly and reliably made by a suitable selection of the dimensions or diameter of the laser beam, while the conducting or conductive layer will safeguard that no material surrounding the insulating or non-conducting layer will be affected by the laser beam. Overall, low expenditures will thus do in respect to the precision of the alignment or orientation of the laser, thus enabling further speeding-up of the method for making holes or perforations in the insulating layer.

Considering the materials usually employed for insulating layers, and in order to achieve an accordingly high process speed while reliably removing the insulating material corresponding to the previously formed holes or perforations in the conducting layer and corresponding to the contacts of the already fixed component, it is proposed according to a further preferred embodiment that for separately forming the holes or perforations in the insulating layer a laser, particularly a pulsed $CO_2$ laser, having a power of 0.1 to 75 W, particularly 0.1 to 7 W, is used for a period or pulse length of 0.1 to 20 µs.

While, in the foregoing, the advantages of separate formations of the holes or perforations in the conducting or conductive layer and in the insulating layer corresponding to the positions of the plurality of contacts of the component fixed to the insulating layer have been discussed, it may be provided according to a further preferred embodiment of the method according to the invention, in order to reduce the method steps, that the holes or perforations in the conducting layer and in the insulating layer are formed in a common method step using a $CO_2$ laser after a pretreatment of the conducting layer. This allows for the production of holes or perforations both in the conducting or conductive layer and in the insulating layer by using a single laser, particularly a $CO_2$ laser, so that the use of, for instance, different lasers or, in general, different method steps for the production of holes or perforations both in the insulating layer and in the conducting layer can be renounced. Since a $CO_2$ laser can usually not be directly employed to make holes or perforations in a conducting or conductive material, it is proposed in this context according to the invention that an appropriate pretreatment of the conducting layer is provided so as to enable the processing of a conducting or conductive layer, particularly at reasonable time. Such a pretreatment, in particular, is to assist the formation of holes or perforations in the conducting or conductive layer when using a $CO_2$ laser.

In this context, it is proposed according to a further preferred embodiment that said pretreatment of the conducting layer comprises the formation of a copper oxide layer on the conducting layer, which is, in particular, covered by an additional organic or metallo-organic layer. The formation of such a copper oxide layer and, optionally or particularly, an additional organic or metallo-organic layer when using a $CO_2$ laser, will enable the direct formation of holes or perforations in the conducting or conductive layer. By applying a single drilling procedure, particularly laser drilling procedure, using a $CO_2$ laser for making holes or perforations both in the conducting and in the non-conducting or insulating layer, there will be no need to provide separate method steps for forming the holes or perforations in the individual layers.

To make the holes or perforations both in the conducting layer and in the insulating layer corresponding to the contacts of the component already fixed to the insulating layer, which are to be exposed by the formation of the holes or perforations, it is, moreover, proposed that a pulse duration of the $CO_2$ laser of at least 200 µs, particularly at least 250 µs, and a maximum pulse count of 5, particularly 3, are chosen to remove the conducting layer and the insulating layer in a common method step, as in correspondence with a further preferred embodiment of the method according to the invention. Such a choice of the parameters of the $CO_2$ laser to be employed, upon pretreatment of the conducting or conductive layer will enable the reliable and precise formation of both the holes or perforations in the conducting or conductive layer and, in a common drilling procedure, of the holes in the non-conducting or insulating layer, so that the contacts of the component already fixed to the insulating layer will be immediately exposed in a common working step.

In order to avoid interferences with, in particular, further patterning of the conducting or conductive layer after the formation of the holes or perforations in a common step and to ensure proper contacting of the exposed contacts of the fixed component, which is to be effected subsequently, it is proposed according to a further preferred embodiment of the method according to the invention that the additional layer applied as a pretreatment of the conducting layer is removed, particularly by an etching step, after the formation of the holes or perforations and prior to further processing steps. Such an etching step in the context of the production of a circuit board is known per se and, if desired, can be combined with a cleaning or etching step provided in another context such that an additional method step can be obviated.

In order to assist the positioning and orientation of the component on the laminate, it is proposed according to a further preferred embodiment that, prior to fixing the component to the insulating layer, at least one marker is formed at least in the insulating layer for registering and aligning the component on the insulating layer. Such a marker can optionally be configured as a depression so as to achieve advantages for further treatment or processing. Moreover, it is to be anticipated that such a marker can be used not only for fixing the component but also for further processing steps.

Particularly when using such a marker, for instance, also in the context of subsequent treatment steps, it may be provided that the at least one marker is formed by a bore or perforation penetrating both the insulating layer and the conducting layer, as in correspondence with a preferred further development of the method according to the invention.

In addition to the simple and reliable production of holes or perforations corresponding to the contacts of the already fixed component, it is proposed according to a further preferred embodiment that, in addition to forming holes or perforations corresponding to the contacts of the component, in the conducting layer and in the non-conducting layer, at least one further perforation is formed outside the region of the fixation of the component to the laminate in order to provide an additional perforation for the formation of a subsequent feedthrough and/or for the formation of the contour of a circuit board element. Due to such a formation of at least one further perforation outside the region of the fixation of the component, and hence the contacts of the same, in particular for the formation of a subsequent feedthrough, it has become possible to provide or realize such a perforation or bore much more closely to the fixed component. Such an additional perforation will thus not have to be formed in a subsequent or independent method step, for instance as a mechanical bore at the end of the overall production process of the circuit board, wherein, by the subsequent or independent formation of such an additional bore, significantly larger process tolerances will have to be observed, in particular, to avoid damage to the already fixed component. When using the at least one additional or further perforation to produce the contour of a circuit board element or printed circuit board corresponding to the contour of a finished circuit board or a circuit board to be produced, it will, moreover, be possible, similarly as in the formation of a subsequent feedthrough, to renounce subsequent mechanical separation processes like milling to produce the contour of a circuit board. A common method or process step will thus also make possible to simultaneously form the contour of the circuit board to be produced, corresponding to the edges of the circuit board, closer to the component to be fixed due to smaller process tolerances, thus miniaturizing the same. The use of, for instance, a laser drilling procedure or laser technology for making the further perforation to form a feedthrough and/or the contour of the circuit board will, in the main, enable a more precise configuration of such additional perforations as opposed to mechanical processing procedures. Furthermore, registering and aligning will, in particular, be improved in that all holes or perforations both for contacting the component by exposing the contacts and for producing additional perforations will be realized in a common working step while jointly aligning and registering. By forming at least one further perforation during, or along with, the formation of holes or perforations in the conducting layer and subsequently also in the insulating layer, it has thus become possible to promote the usually sought miniaturization of a circuit board to be produced, by reducing the mutual distances of individual elements or such a feedthrough or the contour of the circuit board to be produced, of an integrated component. The available surface will thus be significantly better utilized.

To further simplify the production procedure and to increase the accuracy of, in particular, the arrangement of the additional or further perforation, it is proposed according to a further preferred embodiment that the additional perforation is formed relative to the previously produced marker. By arranging in the region of the previously produced marker the additional perforation which, for instance for the formation of a feedthrough or the formation of the contour of the circuit board, has a dimension that is, in particular, larger than the dimensions of the holes or perforations corresponding to the contacts, not only the precise positioning of the additional or further perforation will be achieved, but also the positioning expenditures involved in the formation of said additional perforation will be accordingly minimized.

To further simplify the process control and, in particular, avoid additional method steps, it is proposed according to a further preferred embodiment that the laser beam(s) provided for forming the perforations or holes in the conducting and insulating layers is/are used for forming the perforation for the feedthrough and/or contour. As already pointed out above, the use of optionally different lasers will, in particular, thus accordingly rapidly and reliably enable the realization of the processing or patterning of the conducting or conductive layer as well as the subsequent removal of the material of the insulating layer for producing the additional perforation in a common working step with the formation of the holes or perforations corresponding to the contacts of the fixed component, for instance for providing a subsequent feedthrough.

In particular, in order to provide protection, and/or simplify handling of both the laminate and the component to be fixed thereto, it is proposed according to a further preferred embodiment of the method according to the invention that, prior to fixing the component, at least one carrier or protection layer is provided on the conducting layer, on its surface facing away from the insulating layer, which is removed again prior to forming the holes or perforations in the conducting layer, particularly after sheathing of the component. Such a carrier or protection layer can, in particular, be provided together with the laminate comprised of at least one conducting and one non-conducting or insulating layer, in order to, in particular, enable the protection from damage of the conducting layer, which optionally has an extremely thin thickness, during the process of fixing the component and, in particular, subsequently sheathing the same prior to forming the holes or perforations.

In order to achieve an accordingly good protective effect, it is proposed in this respect according to a further preferred embodiment that a carrier or protection layer is formed by a metallic sheet or polymer. Such a metallic sheet, e.g. a steel or aluminum sheet, can also be used as a pressed sheet and, for instance, protect, during an above-described laminating or pressing procedure for embedding or sheathing the component fixed to the insulating layer, in particular, the conducting layer from the high loads exerted by the pressing and laminating procedure. The metallic sheet for the protection or carrier layer may be replaced with non-conducting materials such as polymers, which, at least during methods steps preceding the formation of the holes or perforations, will likewise provide appropriate protection from damage or contamination of the conducting layer, in particular.

In order to achieve an accordingly good composite effect, particularly when embedding or sheathing the component to be integrated in the circuit board, it is proposed according to a further preferred embodiment that the insulating layer facing the component is formed by a layer improving the adherence between the conducting layer and the material surrounding the component, e.g. a metallo-organic layer or a resin layer or the like.

Due to the process control proposed by the invention for the formation of holes or perforations corresponding to the contacts of the component to be fixed or integrated once the latter has been fixed to the insulating layer, different methods for contacting the conducting layer of the laminate and optionally additional conducting layers can be provided to realize the contacting of the contacts of the embedded or fixed electronic component after the formation of the holes or perforations. In this respect, it is proposed according to a further preferred embodiment, in particular, in order to produce geometries of conducting connections having small dimensions, e.g. dimensions and distances smaller than 50 μm, that the conducting layer for contacting the contacts of the component and/or the conducting layer of the laminate for forming a conducting pattern is applied and/or patterned by a semi-additive or subtractive method.

SHORT DESCRIPTION OF THE DRAWINGS

In the following, the method according to the invention will be explained in more detail by way of exemplary embodiments schematically illustrated in the accompanying drawing. Therein:

FIGS. 2a to 2j depict different steps of a modified embodiment of the method according to the invention for integrating an electronic component into a printed circuit board, wherein the arrangement of a further perforation for forming a feedthrough and/or a contour of the printed circuit board is indicated;

Figure 2G:
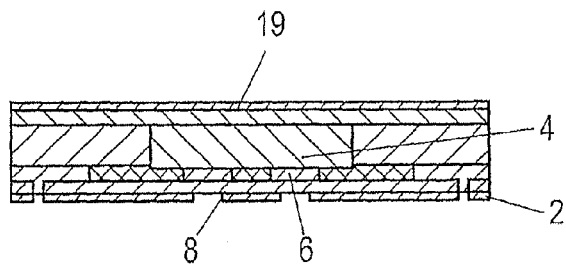
Figure 2H:
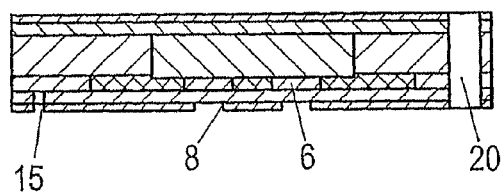
Figure 2I:
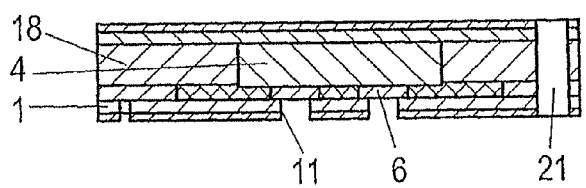
Figure 2J:
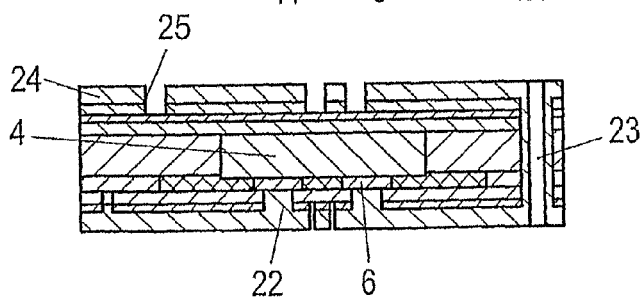
Figure 3:
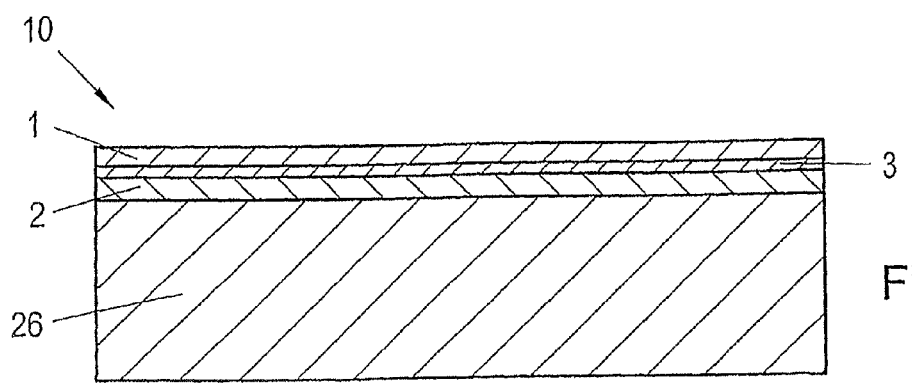
Figure 5A:
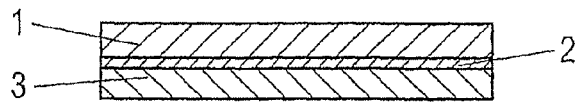
Figure 5B:
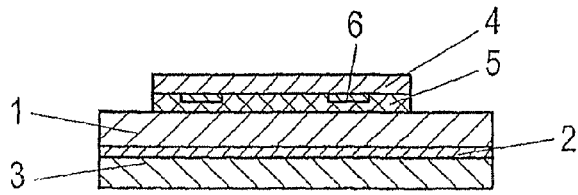
Figure 5C:
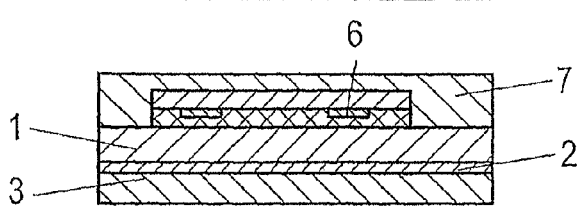
Figure 5D:
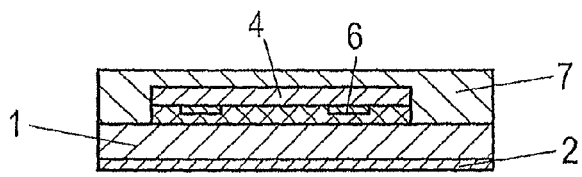
Figure 5E:
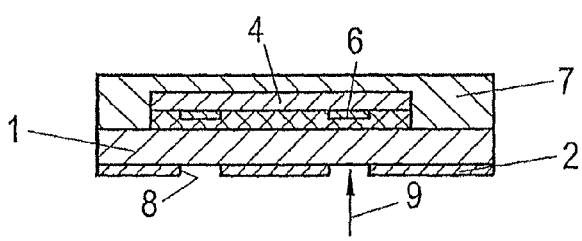
Figure 5F:
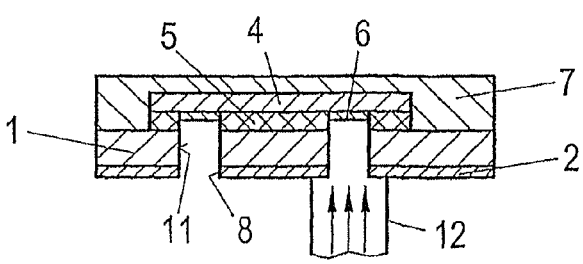
Figure 5G:
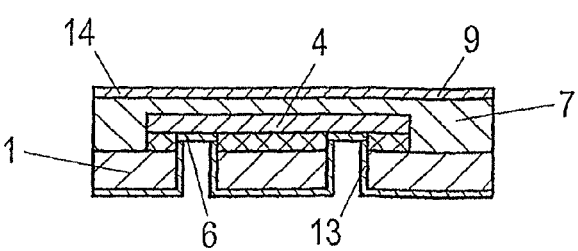
Figure 5H:
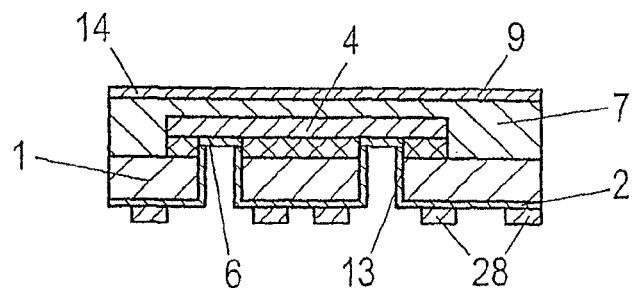
Figure 5I:
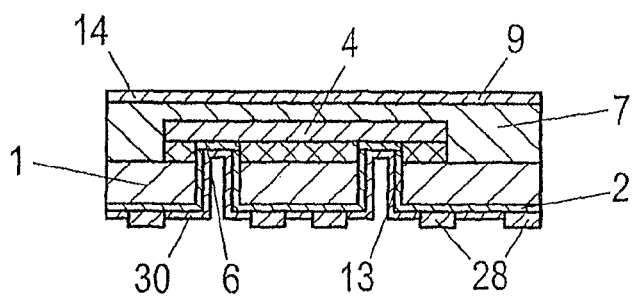
Figure 5J:
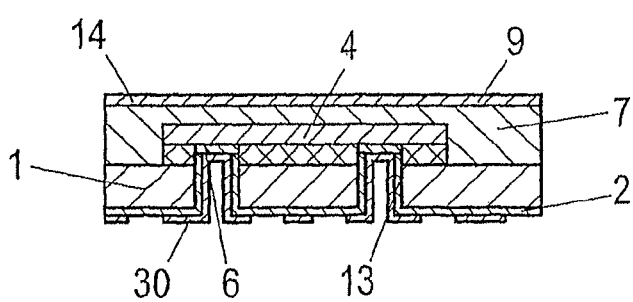
Figure 5K:
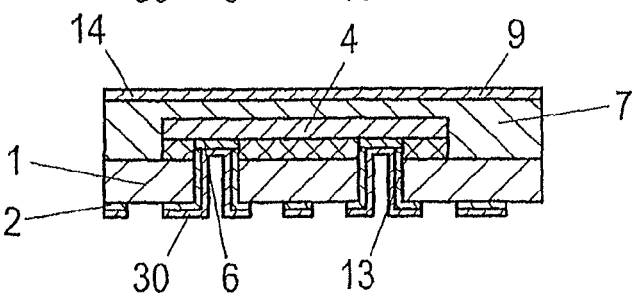
Figure 6:
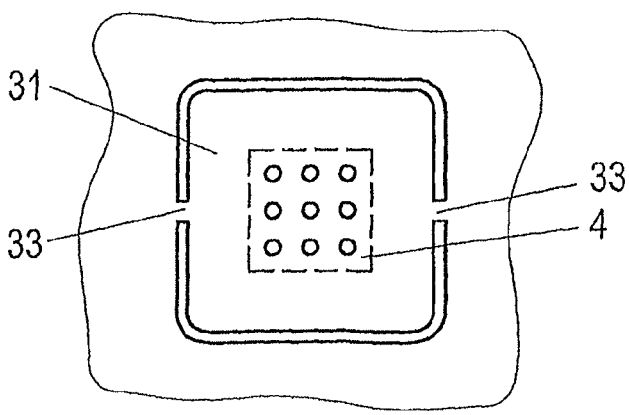

FIG. 3, on an enlarged scale, illustrates a section through a further modified embodiment of a laminate to which a component, for instance according to the embodiments depicted in FIGS. 1 and 2, is to be fixed;

FIGS. 4a to 4h, in an illustration similar to that of FIG. 1, depict different steps of a further modified embodiment of a method according to the invention for integrating an electronic component into a printed circuit board, wherein the holes in the conducting and insulating layers are made in a common working step;

FIGS. 5a to 5k depict different steps of a further modified method according to the invention for integrating an electronic component into a printed circuit board, wherein, as opposed to the method control according to FIG. 1, subsequent patterning is performed in the context of a semi-additive process; and FIG. 6 is a schematic top view on a printed circuit board produced by the method according to the invention, wherein an additional perforation outside the region of the fixed or integrated electronic component is used for forming the contour of the circuit board element.

DETAILED DESCRIPTION OF PREFERRED EMBODIMENTS

In all of the Figures, merely a partial region of a circuit board to be produced, i.e. the area of fixation of an electronic component to be integrated into the circuit board is schematically illustrated. In this respect, it is to be anticipated that, in particular, shown thicknesses of individual layers or sheets as well as dimensions of the electronic component and distances of only a small number of contacts or contact sites serving as examples, as well as dimensions of holes or perforations for contacting the contact sites are not to scale.

Figure 1A:
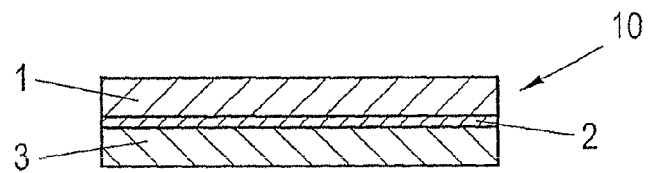
FIGS. 1a to 1j depict different steps of a method according to the invention for integrating an electronic component into a printed circuit board and subsequent patterning in the context of a subtractive method.

In a first method step according to FIG. 1a, a laminate 10 for supporting a subsequently illustrated electronic component to be integrated into a circuit board to be produced is provided, wherein an insulating or non-conducting layer 1, a conducting or conductive layer 2 and, in the embodiment represented in FIG. 1a, an additional protection or carrier layer 3 are provided.

The protection or carrier layer 3 in this case serves to protect the conducting layer 2, which optionally has a comparatively small thickness of, for instance, 50 μm or less and is, for instance, formed by a copper layer.

The conducting layer 2 may in this case be formed by a rolled copper layer, whereby a laminate consisting of at least the insulating or non-conducting layer 1 and the conducting layer 2 can be provided in a simple and cost-effective manner.

Figure 1B:
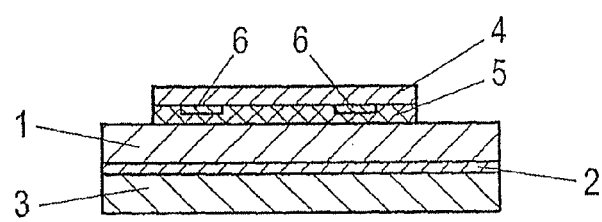

To the laminate 10 comprised of layers 1, 2 and 3, an electronic component 4 is fixed to the insulating layer 1 using an adhesive 5 in the method step illustrated in FIG. 1b, contacts 6 of the electronic component 4 being oriented towards the insulating layer 1.

After having fixed the electronic component 4 to the insulating layer, embedding or sheathing of the same is effected by providing an insulating material 7, such embedding being described in more detail below with reference to FIG. 2 and, in particular, FIGS. 2e and 2f.

In order to improve adherence, the insulating material 1 can be formed by a material supporting the adherence, in particular, between the conducting or conductive layer 2 and the insulating material 7 for embedding the electronic component 4, such a layer or sheet 1 improving the adherence between the individual layers being, for instance, comprised of a metallo-organic layer or a resin layer.

Figure 1C:
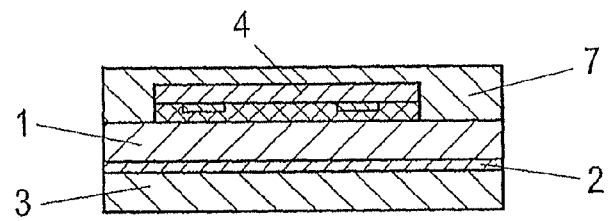
Figure 1D:
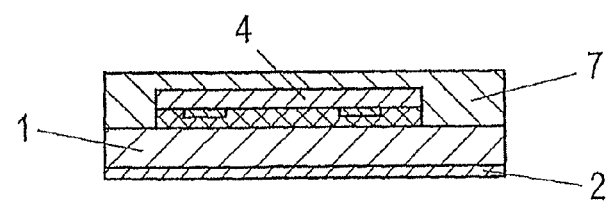

After having formed the sheathing or embedment of the component 4 by the insulating material 7, the carrier layer 3 is removed according to the method step of FIG. 1d, starting from the method step illustrated in FIG. 1c, to thereby expose the conducting or conductive layer 2 protected by the carrier or protection layer 3.

Figure 1E:
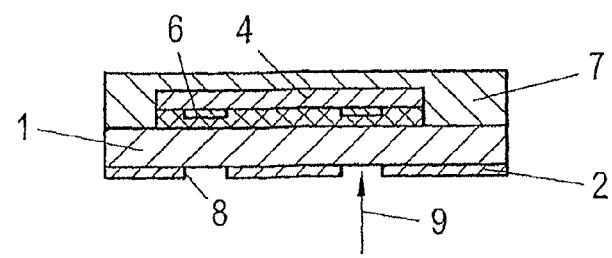

For the subsequent contacting of the contacts 6 of the electronic component 4, holes or perforations 8 are formed in the conducting layer 2 corresponding to the positions of the contacts 6 of the electronic component 4 in the method step illustrated in FIG. 1e, wherein a laser beam 9 is schematically indicated for making the holes or perforations 8.

The laser beam 9 for making the holes or perforations 8 in the conducting or conductive layer 2 is, for instance, formed by a UV laser.

Figure 1F:
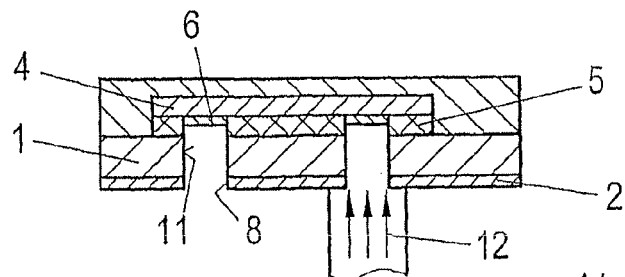

Following the production of the holes or perforations 8 in the conducting or conductive layer 2, holes or perforations 11 corresponding to the positions of the contacts 6 of the electronic component 4 are formed also in the insulating layer 1 as well as, if necessary, in existing residual layers of the adhesive 5 according to the step of FIG. 1f. To make these holes or perforations 11 in the insulating layer 1 as well as, if necessary, in existing residual layers of the adhesive 5, a laser 12 different from the laser 9 is, for instance, used, said laser 12 being, for instance, formed by a $CO_2$ laser in order to achieve accordingly high processing speeds and, at the same time, avoid damage of the contacts 6 of the electronic component 4 to be exposed.

From FIG. 1f, it is moreover apparent that the dimensions of the laser beam 12 exceed the size or dimensions of the hole or perforation 8 in the conducting layer 2, thus enabling the holes or perforations 11 to be produced both in the insulating layer 1 and in the remaining adhesive layer 5 while positioning the laser beam 12 in an accordingly simplified manner. Expensive and complex operations for the adjustment of the laser beam 12 relative to the already produced holes or perforations 8 in the conducting layer 2 can thus be obviated, and adjustment expenditures can be accordingly reduced.

Figure 1G:
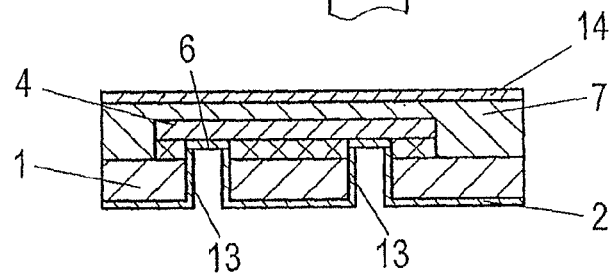

Following the production of the holes or perforations 8 and 11 in the conducting layer 2 and in the insulating layer 1 as well as in the remaining adhesive layer 5, respectively, contacting of the contacts 6 with the conducting layer 2 is effected by applying a further conducting layer 13 at least in the region of the holes or perforations 8 and 11, as is indicated in FIG. 1g.

In FIG. 1g, it is moreover indicated that an additional layer 14 is also arranged or provided on the side facing away from the conducting layer 2.

To remove the insulating material 1 as well as, if necessary, residues of the adhesive 5 in order to produce the holes or perforations 11 in the insulating layer 1, a $CO_2$ laser having the parameters according to Example 1 below is used when providing a comparatively thin insulating layer 1 and/or insulating material easy to remove and/or an adhesive layer 5 with a low filler content.

Example 1

Thin insulating layer (15-30 μm) and/or adhesive with low filler content
Pulsed $CO_2$ laser
Power: 3 watts
Beam diameter: 180 μm
Pulse duration: 6 μs
Number of pulses: 13
Hole diameter: 75 μm Considering the above-indicated parameters relating to the performance of the used $CO_2$ laser, it is apparent that, due to the holes or perforations 8 made by the laser beam 9 in the method step according to FIG. 1e, a suitable cover of the insulating layer 1 located therebehind is provided for forming holes 11 that are contoured according to the contacts 6.

When providing a larger thickness for the insulating layer 1 and/or an adhesive 5 having a higher filler content, and/or for the formation of larger holes or perforations 11, a $CO_2$ laser having an accordingly higher power according to the following Example 2 can be employed.

Example 2

Thick insulating layer (30-50 μm) and/or adhesive with higher filler content
Pulsed $CO_2$ laser
Power: 4 watts
Beam diameter: 280 μm
Pulse duration: 8 μs
Number of pulses: 13
Hole diameter: 120 μm In this manner, even large holes or perforations 11 can be produced in an accordingly short time.

Figure 1H:
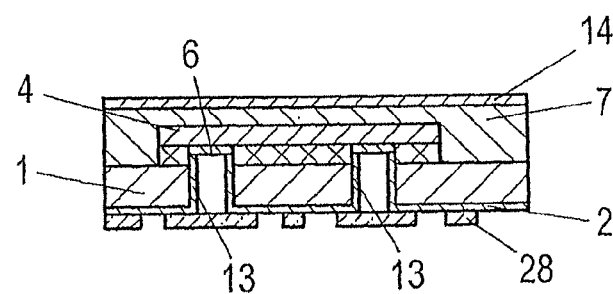

After the production or formation of the further conducting layer 13 for contacting the contacts 6 of the integrated or received component 4, it is indicated in FIG. 1h in the context of a subtractive method that a photoresist 28 is applied for further processing or patterning the conducting layer 2 and, if desired, also the additional conducting layer 13.

Figure 1I:
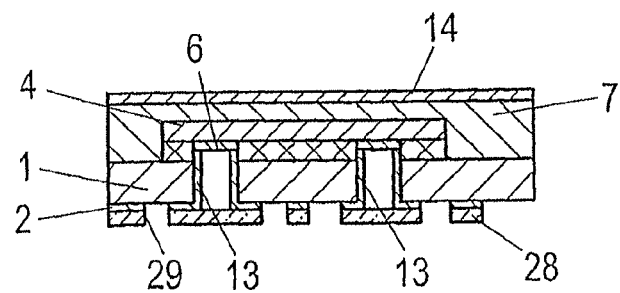

Corresponding to the application of the photoresist 28, a patterning is formed in the conducting layer 2 in a further method step according to FIG. 1i, e.g. by an etching procedure, by making perforations or holes 29 in the conducting layer in regions that are not covered by the photoresist 28.

Figure 1J:
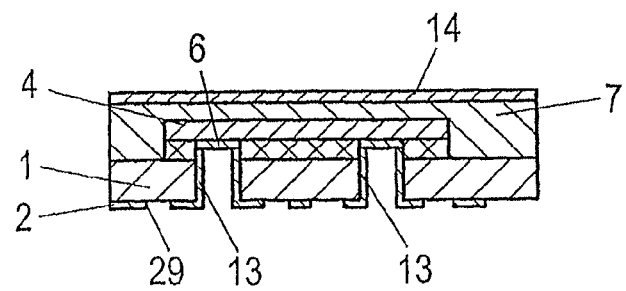

The finished patterning is provided by removing the photoresist 28 as indicated in FIG. 1j.

For the process control illustrated in FIG. 2, the reference numerals of FIG. 1 have been retained for identical components or elements.

According to the method step illustrated in FIG. 2a, a laminate 10 is thus again provided, wherein an insulating or non-conducting layer 1, a conducting or conductive layer 2 as well as a carrier or protection layer 3 are provided.

For aligning or registering the electronic component 4 to be subsequently fixed, additionally produced markers 15 penetrating both the insulating layer 1 and the conducting or conductive layer 2 are indicated in the method step illustrated in FIG. 2b.

In the method step depicted in FIG. 2c, an adhesive again denoted by 5 is applied, whereupon an electronic component again denoted by 4 is fixed to the laminate 10 by the aid of the adhesive 5 in the method step illustrated in FIG. 2d.

Contrary to the embodiment of FIG. 1, according to which the adhesive 5 is merely arranged or provided over a surface or region corresponding to the dimensions of the electronic component 4 to be fixed, a surface exceeding the dimensions of the electronic component 4 to be fixed is provided with the adhesive 5 in the embodiment represented in FIG. 2. Registering and aligning both for applying the adhesive 5 and for fixing the component 4 are, in particular, effected relative to the marker 15.

From the method step depicted in FIG. 2e, it is apparent that a plurality of layers or sheets of insulating material such as prepreg foils, which are denoted by 16 and 17 and configured to at least partially correspond to the dimensions of the component 4 fixed to the laminate 10, are used for sheathing or embedding the electronic component 4 as indicated for the preceding embodiment in FIG. 1c, wherein a laminating or pressing procedure is performed following the positioning of the individual layers as indicated in FIG. 2e so as to obtain the composite element illustrated in FIG. 2f, in which the electronic component 4 is completely surrounded by the mutually laminated or pressed and altogether insulating material 18.

Similarly as with the embodiments according to FIG. 1, the method step depicted in FIG. 2f comprises the removal of the protection or carrier layer 3 so as to expose the conducting layer 2. From the method step depicted in FIG. 2f, it is additionally apparent that a layer denoted by 19 is applied on the surface facing away from the conducting layer 2 for further patterning or further structuring the circuit board to be produced.

In the method step depicted in FIG. 2g, the formation of holes or perforations, which are again denoted by 8, in the conducting or conductive layer 2 is performed corresponding to the positions of the contacts 6 of the electronic component 4 in a manner similar to the method step depicted in FIG. 1e.

In addition to the formation of holes or perforations 8 in the conducting or conductive layer 2, the formation of a further perforation 20 is carried out in the conducting layer 2 as illustrated in the method step according to FIG. 2h, said additional perforation or bore 20 in the embodiment illustrated in FIG. 2h being formed relative to one of the markers 15 and, in particular, in the region or at the position of one of the markers 15.

The formations of the perforations or holes 8 corresponding to the contacts 6 of the electronic component 4 as well as the additional opening or perforation 20 are, for instance, again performed by the aid of a UV laser as described in the context of FIG. 1.

After this, perforations 11 are again formed for exposing the contacts 6 of the electronic component 4 according to the method step depicted in FIG. 2i in a manner similar as in the preceding embodiment. Besides the formation of the perforations or holes 11 in the insulating layer 1, an additional perforation 21 is made in the insulating material 18 embedding the electronic component 4 corresponding to the formation or positioning of the additional perforation 20 in the conducting layer 2.

The formation of the perforations or holes 11 in the insulating layer 1 for exposing the contacts of the electronic component 4, in a manner similar as in the preceding embodiment, may again be rapidly and conveniently performed using a $CO_2$ laser. By selecting the dimensions of the $CO_2$ laser, it will also be possible, with an appropriate size of the latter, to produce the additional perforation 21, which has comparatively larger dimensions, in a common working step.

FIG. 2j, moreover, indicates that, instead of the formation of a conducting layer 13 as indicated in FIG. 1g, an additional conducting layer 22 for contacting the contacts 6 of the electronic component 4 is immediately applied and, by forming a feedthrough 23 in the region of the produced additional perforation 21, contacting with a conducting layer 24 additionally arranged on the opposite side is effected following the production of the perforations 11 and 21, respectively. The additional conducting layers 22 and 24, respectively, as well as the previously produced conducting layer 19 are subjected to additional patterning as indicated by the recesses or perforations 25.

The option of forming the at least one additional perforation 20 or 21 both in the conducting layer 2 and in the insulating layer 1 as well as in the insulating material 18 of the embedment allows for the arrangement or formation of such a feedthrough 23 not only in the context of contacting with the contacts 6 of the electronic component 4, but also by observing smaller distances to the electronic component than would be possible after the completion of the circuit board in successive, separate method steps by, in particular, the mechanical formation of such holes or perforations for the formation of feedthroughs.

Instead of using the at least one additional perforations 20 and 21 in the conducting layer 2 and in the insulating layer 1, respectively, for the subsequent formation of a feedthrough, such an additional perforation 20 or 21 can also be used for providing or defining the contours of a circuit board element incorporating the electronic component 4, as is schematically indicated in FIG. 6.

By forming additional perforations 20 or 21 in a substantially common working step along with the formation of the holes or perforations 8 and 11 in the conducting layer 2 and in the insulating layer 1, respectively, an accordingly high increase of precision in the formation of the contour of the circuit board under observance of reduced process tolerances and, in the main, a miniaturization of the circuit board element to be produced, will thus be achievable.

In the schematic illustration according to FIG. 6, it is indicated that, for the formation of the contour of the circuit board element in which the component 4 is embedded, the additional perforations 20 and 21 basically constitute a continuous line surrounding the electronic component 4, with the exception of predetermined breaking points 33 for temporary anchoring or fixing. For the sake of simplicity, no patternings of the conducting layer 2 are illustrated or indicated in FIG. 6. Due to the formation of the contour by producing the at least one further perforation 20 and/or 21, respectively, a further miniaturization of such a circuit board element 31 will be achieved while enhancing the exploitation of the available surface area.

The insulating material 1 even in the embodiment illustrated in FIG. 2 can be formed by a material especially supporting or promoting the adherence between the conducting layer 2 and the material 8 surrounding the component 4 as well as the individual layers 16 and 17.

FIG. 3, on a scale enlarged relative to the preceding Figures, depicts a modified embodiment of a laminate again denoted by 10, wherein an additional carrier layer 26 is provided besides the insulating layer 1, the conducting or conductive layer 2 and a protection layer 3. The carrier layer 26 is, for instance, formed by a metallic sheet so that such a carrier layer or metallic sheet 26 can, for instance, be directly used as a pressing sheet in the laminating or pressing procedure illustrated in FIGS. 2e and 2f, such a carrier sheet 26 having an accordingly sufficiently high mechanical strength. In this manner, also the appropriate protection of, in particular, the conducting layer 2, which optionally has a comparatively small thickness of 50 μm or less, will be ensured particularly during loading procedures prior to the formation of the holes or perforations 8 and 11 for contacting the contacts 6 of the electronic component 4.

In the modified embodiment depicted in FIG. 4, the steps illustrated in FIGS. 4a to 4d correspond to the steps represented in FIGS. 1a to 1d, so that further description of these steps will be omitted.

Figure 4A:
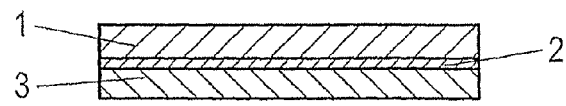
Figure 4B:
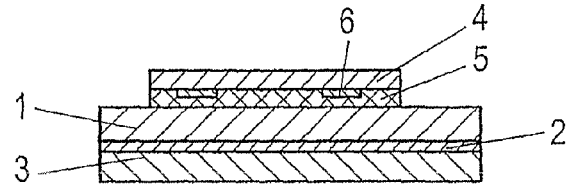
Figure 4C:
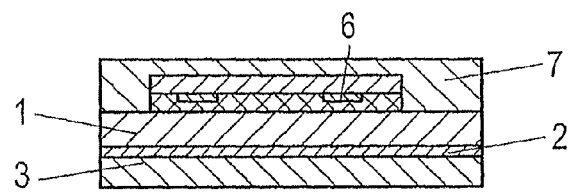
Figure 4D:
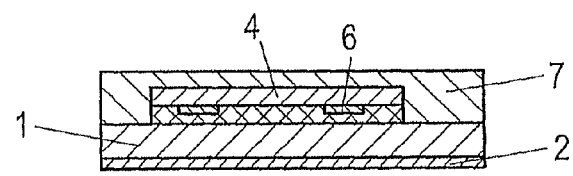
Figure 4E:
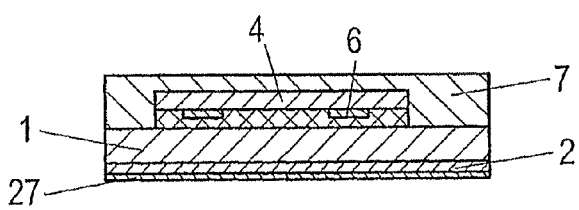

In the method step depicted in FIG. 4e, the application of a copper oxide layer 27, which is optionally covered by a further organic or metallo-organic layer, which is, however, not illustrated separately, takes place in the context of a pretreatment of the conducting or conductive layer 2 upon removal of the carrier or protection layer 3.

Figure 4F:
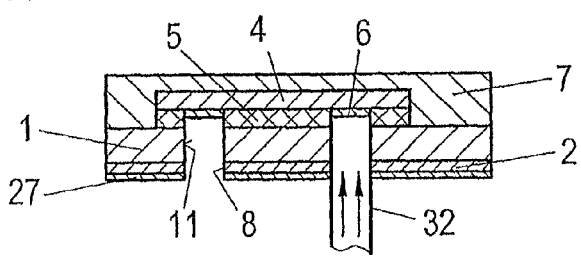

After such a pretreatment, or application of an additional layer 27 to the conducting or conductive layer 2, the formation of holes or perforations 8 and 11 corresponding to the contacts 6 of the electronic component 4 is performed both in the conducting layer 2 and in the additional layer 27 arranged thereon as well as in the insulating layer 1 in a common working step, to which end a laser corresponding to the schematic $CO_2$ laser 32 is employed as illustrated in FIG. 4f.

By providing the additional or pretreatment layer 27 on the conducting or conductive layer 2, the appropriate formation of perforations or holes 8 and 11 corresponding to the contacts 6 of the electronic component 4 can thus be effected in a common working step using a $CO_2$ laser 32.

To supply the power also required for making the holes or perforations 8 in the conducting layer when using a $CO_2$ laser 32, a pulse duration of at least 200 μs, e.g. about 285 μs, which is elevated relative to that of the $CO_2$ laser 12 which is merely used to remove the insulating layer as discussed with reference to FIG. 1, is proposed. By applying such an extended pulse duration, a reduced number of pulses, e.g. 5 and, in particular, 2 pulses, will do to make the holes or perforations 8 and 11, respectively, in the conducting layer 2 and in the pretreatment layer 27 attached thereto as well as in the insulating layer 1 for exposing the contacts 6 of the component 4.

Figure 4G:
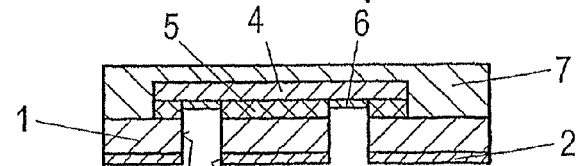
Figure 4H:
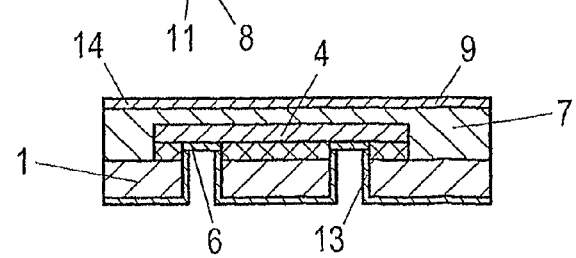

Following such a production of holes or perforations 8 and 11 in the conducting layer 2 and in the insulating layer 1, respectively, the removal of the additional or pretreatment layer 27 is effected, for instance by etching, as indicated in FIG. 4g.

The formation of an additional conducting or conductive layer 13 according to the illustration of FIG. 4h again corresponds to the method step depicted in FIG. 1g.

After this, patterning can be done as, for instance, indicated in FIGS. 1h to 1j.

For subsequent patterning, either a conducting layer 2 having an appropriate thickness, of the laminate 10 is used, or an appropriate additional conducting or conductive layer may be applied or formed to achieve the required layer thickness for the formation of the conducting or conductive pattern, e.g. in the form of conductor tracks, on the conducting or conductive layer 2 of the laminate 10, this being not illustrated in detail for the sake of simplicity.

In the illustration according to FIG. 5, the method steps according to FIGS. 5a to 5f again correspond to the steps according to FIGS. 1a to 1f, so that a detailed description of the same will not be repeated.

To provide the contacting of the contacts 6 of the integrated component 4, chemical coppering as indicated in FIG. 5g is performed, such an additional conducting layer for contacting the contacts 6 of the component 4 being again denoted by 13.

In a subsequent method step according to FIG. 5h, a mask formed by a photoresist 28 is again applied, whereupon, according to the method step depicted in FIG. 5i, wiring paths are, for instance, formed by so-called plating in the context of a semi-additive method, said wiring paths being indicated by 30.

According to the method step depicted in FIG. 5j, the wiring paths 30 are exposed by removing the photoresists 28 so as to achieve overall patterning, whereupon, according to the method step depicted in FIG. 5k, also partial regions of the conducting or conductive, thin copper layer 2 are removed corresponding to the wiring paths 30, for instance by flash-etching, so as to achieve overall patterning of the conducting or conductive layer formed by layers 2 and 30.

As in the embodiment according to FIG. 2, also in the modified methods illustrated in FIGS. 4 and 5 at least one further perforation 20 and 21, respectively, can be produced in addition to the contacting of the integrated component, in order to subsequently provide a feedthrough 23 or form the contour of the circuit board element 31, as has been discussed in detail with reference to FIG. 2 as well as FIG. 6.

The invention claimed is:

1. A method for integrating an electronic component into a printed circuit board, comprising the following steps in the following sequence:
providing a laminate comprising an electric conductive layer and an electric insulating layer;
forming at least one marker in the insulating layer for registering and aligning the electronic component on the insulating layer, wherein the at least one marker is formed by a bore or perforation penetrating both the insulating layer and the conductive layer;
fixing the electronic component to the insulating layer, the electronic component comprising extrusions oriented towards the insulating layer;
forming holes or perforations in the conductive layer at locations near the extrusions of the electronic component by using an UV laser;
forming holes or perforations in the insulating layer at locations near the extrusions of the electronic component; and
connecting the extrusions with the conductive layer.

2. The method according to claim 1, wherein the electronic component, once it has been fixed to the insulating layer, is surrounded or sheathed by an additional insulating material.

3. The method according to claim 2, wherein the sheathing of the electronic component is realized by a pressing or laminating procedure of a plurality of insulating layers.

4. The method according to claim 1, wherein the electronic component is fixed to the insulating layer by using an adhesive.

5. The method according to claim 4, wherein the adhesive is a thermally conducting or conductive adhesive.

6. The method according to claim 1, wherein the holes or perforations in the conductive layer are formed by a drilling procedure.

7. The method according to claim 1, wherein the holes or perforations in the insulating layer are made by a laser.

8. The method according to claim 7, wherein a laser beam whose dimension or diameter exceeds the clear width of the holes or perforations in the conductive layer is used for separately forming the holes or perforations in the insulating layer.

9. The method according to claim 7, wherein for separately forming the holes or perforations in the insulating layer a laser having a power of 0.1 to 75 W is used for a period or pulse length of 0.1 to 20 µs.

10. The method according to claim 1, wherein the holes or perforations in the conductive layer and in the insulating layer are formed in a common method step using a $CO_2$ laser after a pretreatment of the conductive layer.

11. The method according to claim 10, wherein said pretreatment of the conductive layer comprises the formation of a copper oxide layer on the conductive layer, which is, in particular, covered by an additional organic or metallo-organic layer.

12. The method according to claim 10, wherein a pulse duration of the $CO_2$ laser of at least 200 µs and a maximum pulse count of 5 are chosen to remove the conductive layer and the insulating layer in a common method step.

13. The method according to claim 10, wherein that the additional layer applied as a pretreatment of the conductive layer is removed by an etching step, after the formation of the holes or perforations and prior to further processing steps.

14. The method according to claim 1, wherein, prior to fixing the component to the insulating layer, at least one marker is formed at least in the insulating layer for registering and aligning the component on the insulating layer.

15. The method according to claim 14, wherein the at least one marker is formed by a bore or perforation penetrating both the insulating layer and the conductive layer.

16. The method according to claim 1, wherein, in addition to forming holes or perforations corresponding to the contacts of the component in the conductive layer and in the insulating layer, at least one further perforation is formed outside the region of the fixation of the component to the laminate for providing an additional perforation for the formation of a subsequent feedthrough and/or for the formation of the contour of a circuit board element.

17. The method according to claim 16, wherein the additional perforation is formed relative to the previously produced marker.

18. The method according to claim 16, wherein the laser beam(s) provided for forming the perforations or holes in the conductive and insulating layers is/are used for forming the perforation for the feedthrough and/or contour.

19. The method according to claim 1, wherein, prior to fixing the component, at least one carrier or protection layer is provided on the conductive layer, on its surface facing away from the insulating layer, which is removed again prior to forming the holes or perforations in the conductive layer after sheathing of the component.

20. The method according to claim 19, wherein a carrier or protection layer is formed by a metallic sheet or polymer.

21. The method according to claim 1, wherein the insulating layer facing the component is formed by a layer improving the adherence between the conductive layer and the material surrounding the component.

22. The method according to claim 1, wherein the conductive layer for contacting the contacts of the component and/or the conductive layer of the laminate for forming a conductive pattern is applied and/or patterned by a semi-additive or subtractive method.

* * * * *